(12) United States Patent
Beiss et al.

(10) Patent No.: US 6,340,212 B1
(45) Date of Patent: Jan. 22, 2002

(54) APPARATUS FOR HOLDING AN INPUT UNIT

(75) Inventors: Max Beiss, Ismaning; Joseph Dietl, Unterhaching, both of (DE)

(73) Assignee: Océ Printing Systems GmbH, Poing (DE)

( * ) Notice: Subject to any disclaimer, the term of this patent is extended or adjusted under 35 U.S.C. 154(b) by 0 days.

(21) Appl. No.: 09/297,158

(22) PCT Filed: Oct. 21, 1997

(86) PCT No.: PCT/DE97/02442

§ 371 Date: Jun. 18, 1999

§ 102(e) Date: Jun. 18, 1999

(87) PCT Pub. No.: WO98/18305

PCT Pub. Date: Apr. 30, 1998

(30) Foreign Application Priority Data

Oct. 22, 1996 (DE) .......................... 196 43 633

(51) Int. Cl.⁷ .............................. A47B 81/00
(52) U.S. Cl. ................. 312/223.3; 312/332.1; 312/333
(58) Field of Search .............. 312/334.11, 332.1, 312/333, 334.44, 344.46, 334.47, 312, 223.1, 223.2; 108/50.01; 248/918; 361/681, 682, 683, 724, 725

(56) References Cited

U.S. PATENT DOCUMENTS

| | | | |
|---|---|---|---|
| 1,902,425 A | * 3/1933 | Stouges | 312/344.47 X |
| 2,343,977 A | * 3/1944 | Jones et al. | 312/333 X |
| 2,769,551 A | * 11/1956 | Just | 312/333 |
| 3,658,398 A | * 4/1972 | Abbate, Jr. et al. | 312/333 |
| 3,897,123 A | * 7/1975 | Schmitt | 312/333 |
| 3,954,315 A | * 5/1976 | Sanden | 312/333 |
| 4,718,740 A | 1/1988 | Cox | |
| 4,749,242 A | * 6/1988 | Rechberg | 312/333 |
| 5,388,032 A | 2/1995 | Gill et al. | |
| 5,405,195 A | * 4/1995 | Hobbs | 312/334.32 X |
| 5,487,525 A | * 1/1996 | Drabczyk et al. | 248/918 X |
| 5,595,428 A | * 1/1997 | Huang | 248/918 X |
| 5,758,935 A | * 6/1998 | Coonan | 312/223.2 |
| 5,801,921 A | * 9/1998 | Miller | 361/686 |
| 5,918,875 A | * 7/1999 | Masley et al. | 312/332.1 X |
| 6,082,844 A | * 7/2000 | Hausler et al. | 312/334.27 X |

FOREIGN PATENT DOCUMENTS

| | | |
|---|---|---|
| DE | 146 137 | 1/1981 |
| DE | G 82 12 927.4 | 8/1982 |
| DE | 31 03 481 | 8/1987 |
| DE | G 89 13 798.1 | 4/1990 |
| DE | G 93 04 289.2 | 7/1993 |
| DE | 43 31 110 | 10/1994 |
| GB | 2 133 222 | 7/1984 |

* cited by examiner

*Primary Examiner*—Peter M. Cuomo
*Assistant Examiner*—Hanh V. Tran
(74) *Attorney, Agent, or Firm*—Schiff Hardin & Waite

(57) ABSTRACT

An apparatus has an arrangement for an input unit which provides control data for an electrical apparatus such as a printer or a copier and the arrangement allows the input unit to be shifted between an idle position within a cabinet of the apparatus to an operating position which extends outside of the cabinet to allow access. The arrangement is inclined so that the movement from the idle to the operating position is in a downwardly inclined direction.

16 Claims, 3 Drawing Sheets

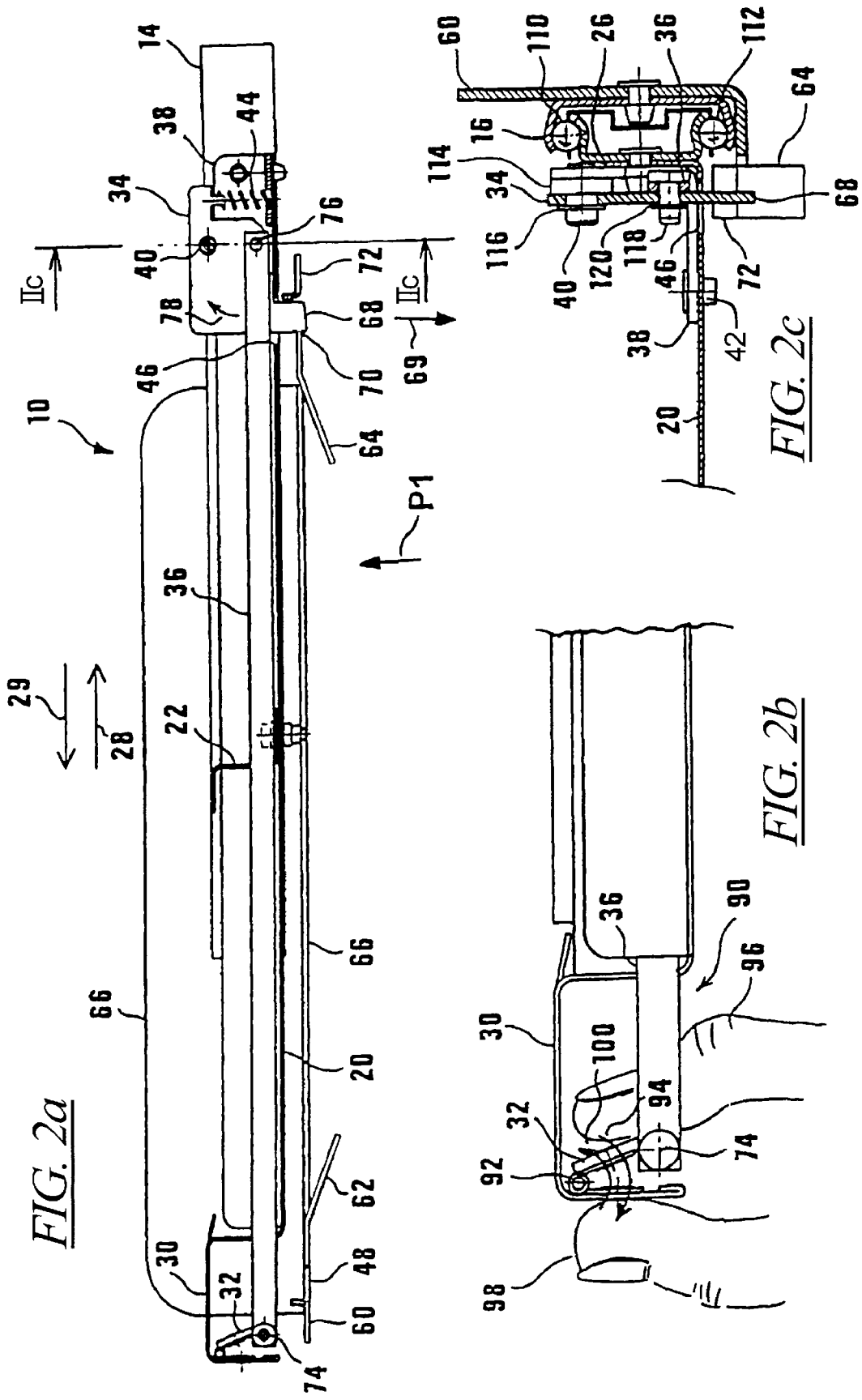

APPARATUS FOR HOLDING AN INPUT UNIT

BACKGROUND OF THE INVENTION

The invention relates to an apparatus for holding an input unit for inputting control data for an electrical device, in particular to a printer or copier.

Printers and copiers are known in which the input unit, e.g. a keyboard and, if warranted, an associated display unit, is attached externally to the printer. Particular operating modes are selected via the keyboard during disturbance-free operation of the printer. Thus, for example, the number of pages to be printed, the print format or a particular print mode (simplex, duplex) can be selected. If a disturbance occurs in the printer, then control data are inputted via the keyboard by a qualified operator that cause localization or, respectively, removal of the error. A disadvantage is that the keyboard is relatively unprotected, so that undesired inputs can also take place, e.g. if an operating personnel lean on the keyboard or if objects are placed on it.

Keyboards are also known that are removed from a mechanical mount in the printer and are suspended in a sheathing panel of the device with holding elements. However, this requires a number of manual operations to be carried out by an operator, which worsen the operability of the printer.

From DE 43 31 110 A1, a withdrawable holding apparatus is known for a switching cabinet. However, due to the inclined construction of the held keyboard a larger constructive space is required in the switching cabinet. This also holds for the keyboard of a data processing installation addressed in the utility model G 82 12 927, which keyboard can be pulled out on a support.

From DE 31 03 481 C2, a withdrawable keyboard is known that however must be moved along a curved path.

In the utility model G 89 13 798, a withdrawable keyboard is explained that is tilted into an angled position outside the device. The guide mechanism required for this results in an unstable mounting of the keyboard in the operating position.

U.S. Pat. No. 4,718,740 discloses an apparatus for holding an input unit that comprises a keyboard for inputting data. The apparatus, together with a display unit, can be pivoted about a pivot axle. The apparatus can be pivoted out of a vertical idle position into an approximately horizontal operating position.

U.S. Pat. No. 5,388,032 and GB-A-2,133,222 disclose similar devices, whose input unit with a keyboard can be displaced exclusively in a horizontal plane. In the idle position, the input unit is pushed into a device, together with a display unit if necessary.

SUMMARY OF THE INVENTION

The object of the invention is to provide a simple, space-saving apparatus for holding the input unit, that is inclined to the horizontal in the operating position and that takes up little space inside the device when in the idle position.

This object is achieved by means of an apparatus of the type named above in that it has at least one guide element arranged on the input unit, which guide element is housed movably by a housing element arranged on the device. The input unit is thereby essentially movable in a plane between an idle position and an operating position. In the idle position, the input unit is mounted inside the device, and in the operating position the input unit can be actuated from the outside. The invention is based on the consideration that the input unit is to be available to an operator of the printer or copier only when the operator actually wishes to input control data and/or is authorized or, respectively, qualified for the input of control data. However, in the case (rare in comparison to the overall operating time) in which the operator requires the input unit, no great additional expense, and associated loss of time, should be allowed to arise for the operator. In the invention, a guide element is thus arranged at the input unit that enables a movement of the input unit in a plane between the idle position and the operating position. Supported by the guide element, the input unit can thus be moved in a linear fashion by the operator. This linear movement is conceivably simple, so that it can also be executed at a high speed by the operator. The input unit thus need not be guided along a curved path or suspended in a predetermined position. The invention thus enables rapid access to the input unit.

In the idle position, the input unit according to the invention is mounted inside the device, so that an accidental actuation is effectively prevented by a sheathing of the device. In the idle position, the input unit is thus hardly or not at all visible from the outside. The number of visible operating elements is reduced, so that the operation of the apparatus is simplified. In contrast, in the invention the input unit can be actuated freely from the outside in the operating position, so that the operator has an ergonomically advantageous freedom of operation.

In the invention, the housing element is arranged at an angle to the horizontal, so that the input unit is also slightly inclined in the operating position. The inclination is dependent on the height at which the input unit is arranged. It is selected such that an ergonomic operating position results for the operator during the inputting of the control data. By means of the inclination of the housing element, the input unit itself can be executed in a flat and therefore space-saving manner.

In an embodiment of the invention, the guide element is arranged in an edge region of the input unit, and a second guide element is arranged on an opposed edge region of the input unit. With the aid of two guide elements, the input unit can be held very stably, so that pressure forces during the inputting of the control data are well-compensated, and the input unit lies still during the inputting.

In a further embodiment of the invention, in the operating position the end of the guide element facing away from the device projects beyond the end of the housing element facing away from the device. This measure enables a compact construction of the holding apparatus to be achieved, since this apparatus can be withdrawn from the device in the manner of a telescope extension.

If, in another embodiment of the invention, in the operating position the guide element is fixed in its position by a snap element, then forces can also occur in the direction of motion of the input unit during the inputting of the control data, without a change of the position of the input unit. If the input unit is also fixed in the idle position, then an automatic movement of the input unit, due for example to shaking movements of the device during operation, or to gravity given an inclined mounting of the input unit, is prevented. If the snap element is arranged on the end region of the guide element facing the device, then a single snap element can be used both in the operating position and also in the idle position. A lever that is connected with the snap element and that ends near the input unit simplifies the actuation of the snap element.

The snap element can be constructed in such a way that a resetting element, such as for example a spring, automatically positions the snap element into a normal position that is also assumed when the guide element is fixed. The resetting force can be used for the braking of the input unit during movement into the idle position or, respectively, into the operating position. For this purpose, in the region of movement of the snap element there are inclined surfaces or slopes on which the snap element runs and these surfaces press the snap element out of its normal position shortly before achieving the idle position or the operating position of the input unit. Then as the distance from the normal position increases, an increasing braking effect develops on the slopes, whereby due to the connection of the snap element and the input unit the motion of the input unit is also braked. This braking of the input unit leads to an increase in the durability of the holding means, since high mechanical stresses due to impact are also avoided in the achieving of he idle position or the operating position. During the reaching of the idle position or the operating position, the input unit is also protected, by the braking apparatus, from vibrations that damage the input unit. As a braking apparatus, stop elements made of an elastic material are also used, which are preferably arranged on stop surfaces of the guide elements.

If a support surface is arranged on the end of the guide element facing away from the device, transverse to the direction of motion, operability increases, since an operator can support his hand surfaces on this support surface during the inputting of the control data. An actuation element for the actuation of the snap element is arranged in a hollow space underneath the support surface, so that the operator engages the support surface from underneath, and withdraws the input unit from the device in the manner of a drawer. The actuation element usefully runs over the entire width of the input unit, so that the access to the actuation element can take place reliably despite the blocking of the view by the support surface.

In an embodiment of the invention, the actuating element and the braking apparatus are coupled with one another in such a way that the braking apparatus is released when the actuating element is actuated. This measure enables frictionless movement of the input unit. As long as the input unit is guided by the hand of the operator, this determines the movement speed of the input unit. If the input unit slips out of the hand of the operator or is let go, the actuating element is no longer actuated, and the braking apparatus is now activated, thus preventing an impact of the keyboard when the idle position or operating position is reached.

If a locking means, preventing movement of the input unit into the operating position, is arranged in the direction of movement of the input unit in the idle position, access to the input unit can be limited effectively. Besides locks, a sheathing of the apparatus that can be removed only with a tool is also used as a locking means, which sheathing has to be removed anyway by a service technician in case of service. Thus, in case of service only a qualified person can input control data via the input unit, so that in particular misoperations by unqualified persons are excluded.

BRIEF DESCRIPTION OF THE DRAWINGS

FIG. 2a is a longitudinal cross sectional view taken on line IIa—IIa of FIG. 1,

FIG. 2b is an enlarged side view of the outer end of the holding apparatus;

FIG. 2c is a cross sectional view taken on line IIc—IIc of FIG. 2a;

DESCRIPTION OF THE PREFERRED EMBODIMENTS

Figure 1:
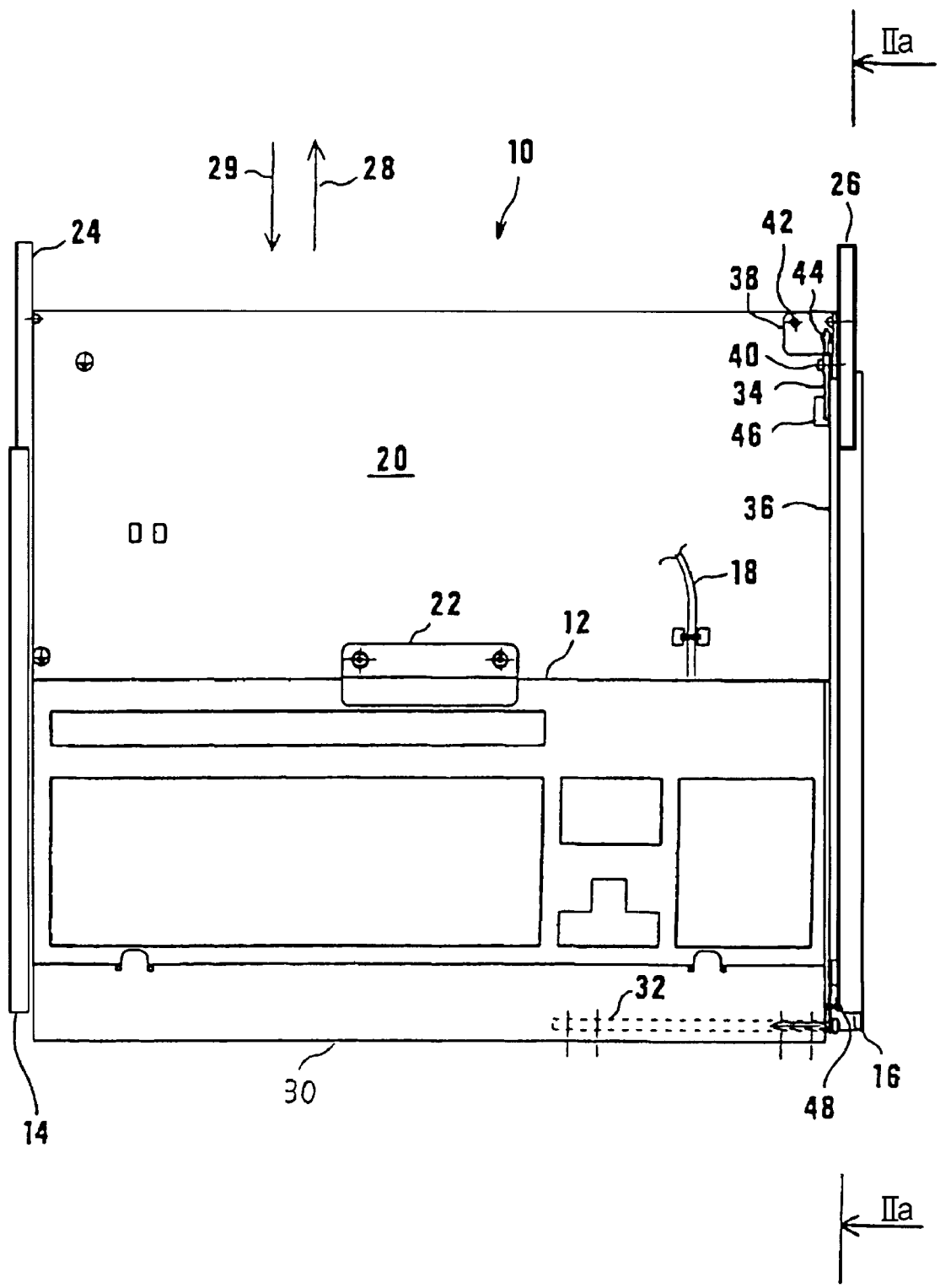
FIG. 1 is a top view of a holding apparatus for holding a keyboard.

FIG. 1 shows a top view of a holding apparatus 10 for holding a keyboard 12, e.g. a known personal computer keyboard. Via the keyboard 12, an operator inputs control data for a printer of FIG. 3a on whose frame two guide receptacles 14, 16 (FIG. 1) are fastened. The control data are transmitted to a central control unit of the printer by the keyboard 12 via a connection line 18. The keyboard 12 is fastened on a base plate 20 with the aid of a fastening sheet 22 which has a Z shape as shown in FIG. 2a. The base plate 20 is angled off on both sides of the keyboard 12, so that on the one hand its bending rigidity is increased and on the other hand fastening possibilities are created for telescoping rails 24 and 26. The telescoping rail 24 is surrounded by the guide receptacle 14 and the telescoping rail 26 is surrounded by the guide receptacle 16, so that the base plate 20, together with the keyboard 12, can be moved in the plane defined by the base plate 20, longitudinal to the guide receptacles 14, 16, as indicated by arrows 28 and 29.

FIG. 1 shows the keyboard in an idle position in which the rails 24 and 26 are located essentially inside the guide receptacles 14 and 16. If the keyboard is moved in the direction of the arrow 29, the rails 24 and 26 are guided through the guide receptacles 14 and 16 until an operating position is reached, and until almost their entire length protrudes beyond the guide receptacles 14 and 16.

On the side of the base plate 20 facing away from the printer, there is a support surface 30 for the application of the hand surfaces of an operator during the inputting of the control data. Underneath the support surface 30 there is an actuating element 32, only outlined in FIG. 1, for the actuation of a snap element 34 via a lever or link 36. The manner of operation of the actuating element 32, of the snap element 34 and of the lever 36 is explained below on the basis of FIGS. 2a, 2b and 2c. The snap element 34 is mounted on an angle steel 38 (FIG. 1) so as to be pivotable about an axis of rotation 40. The angle steel 38 is connected with the base plate 20 via a rivet connection 42. In addition, a spring 44 is fastened to the angle steel 38, which spring presses the snap element 34 through an opening 46 (best shown in FIG. 2a) in the base plate 20. In the normal position of the snap element 34, i.e. without an actuation of the actuating element 32, in the idle position the base plate 20, and thereby also the keyboard 12, is fixed on a sheet 60 so that an automatic movement in relation to the guide receptacles 14 and 16 is excluded.

Another opening 48 is located on the end of the sheet 60 facing away from the printer (cf. FIG. 2). The receptacle 48 receives the snap element 34 in the operating position, so that in turn the base plate 20 is fixed in relation to the guide receptacles 14 and 16, and thus in relation to the printer as a whole.

The opening 48 is located in an angled sheet 60 that is fastened to the guide receptacle 16, as explained below and as shown in FIG. 2c. Slopes 62 and 64, falling off in opposed directions, stand out from the sheet 60. A sheet 66 on the other side of the holding apparatus 10 is fastened between the guide receptacle 14 and the frame of the printer, but has no receptacles or slopes. If, in another embodiment, snap elements are however present on both sides of the base plate, the sheet 66 is also manufactured with slopes and openings.

The snap element 34 has a projection 68 that is pressed in the direction of an arrow 69 by the spring 44, so that in the idle position the projection that protrudes through the opening 46 is arranged between a stop surface 70 and 72 of the sheet 60, so that given a movement of the base plate 20 in the direction of the arrow 29, the projection 68 impacts on the stop surface 70, and given a movement in the direction of the arrow 28 it impacts on the stop surface 72.

The snap element 34 is detached in that an operator moves the actuating element 32 away from the printer. The movement of the actuating element 32 is communicated up to the snap element 34 via the lever or linkage 36. For this purpose, the lever or linkage 36 is connected at its one end with the actuating element 32 via a bearing 74, and at its other end it is connected with the snap element 34 via a bearing 76. If the actuating element 32 is actuated, the snap element 34 moves in the direction of an arrow 78, whereby the projection 68 is lifted far enough that a movement of the base plate 20 in the direction of the arrow 29 is henceforth possible. The projection 68 thus no longer impacts the stop surface 70 when the base plate 20 is drawn into the operating position. In the operating position, when the operator lets go of the actuating element 32 the projection 68 snaps into the opening 48, whereby the base plate 20 is fixed in relation to the sheet 60, since without actuation of the actuating element 32 the projection 68 impacts the edges of the opening 48, without movement of the base plate 20 and thus also of the keyboard 12.

The slopes 62 and 64 serve as a braking means if, during movement of the base plate 20 into the idle position or into the operating position, the actuating element 32 is no longer actuated. In this case, the projection 68 is again pressed into its normal position by the spring 44; when the operating position is reached it comes into contact with the slope 62, and when the idle position is reached it comes into contact with the slope 64. The slopes 62 and 64 force the projection in the direction of the arrow 78, against the spring force of the spring 44. As the excursion of the projection 68 increases, the spring 44 acts as a brake.

FIG. 2b shows an enlargement of the support surface 30 according to the sectional representation of part of FIG. 2a. The support surface 30 is an extension of the base plate 20, and is bent in such a way that a hollow space 90 arises in which the actuating element 32 is fastened to a hinge 92 that is fastened to the other hinge surface on the support surface 30. The actuating element 32 can thus be pressed in the direction of an arrow 94 by the finger 96 of an operator. The external surface of the support surface 30 can thereby serve as a counter-pressure surface for a thumb 98 of the operator. The spring force of the spring 44, communicated via the snap element 34 and the lever 36, draws the actuating element 32 in the direction of an arrow 100.

FIG. 2c shows a sectional representation of the holding apparatus 10 along the section line IIc—IIc of FIG. 2a, which is transverse to the direction of movement 28, 30 of the base plate 20. However, the snap element 34 is thereby located in a position P1 according to FIG. 2a. Balls 110 and 112 are located between the telescope rail 26 and the guide receptacle 16, which decrease the friction during the movement of the base plate 20.

The snap element 34 is fastened to a bolt 114 with the aid of a securing ring 116. The bolt 114 is connected in stationary fashion with the angle steel 38. A bolt 118 connects the lever 36 and the snap element 34. A securing ring 120 thereby holds the lever 36 and the bolt 118 close to one another, whereby however a rotational movement is enabled between the lever 36 and the snap element 34.

Figure 3A:
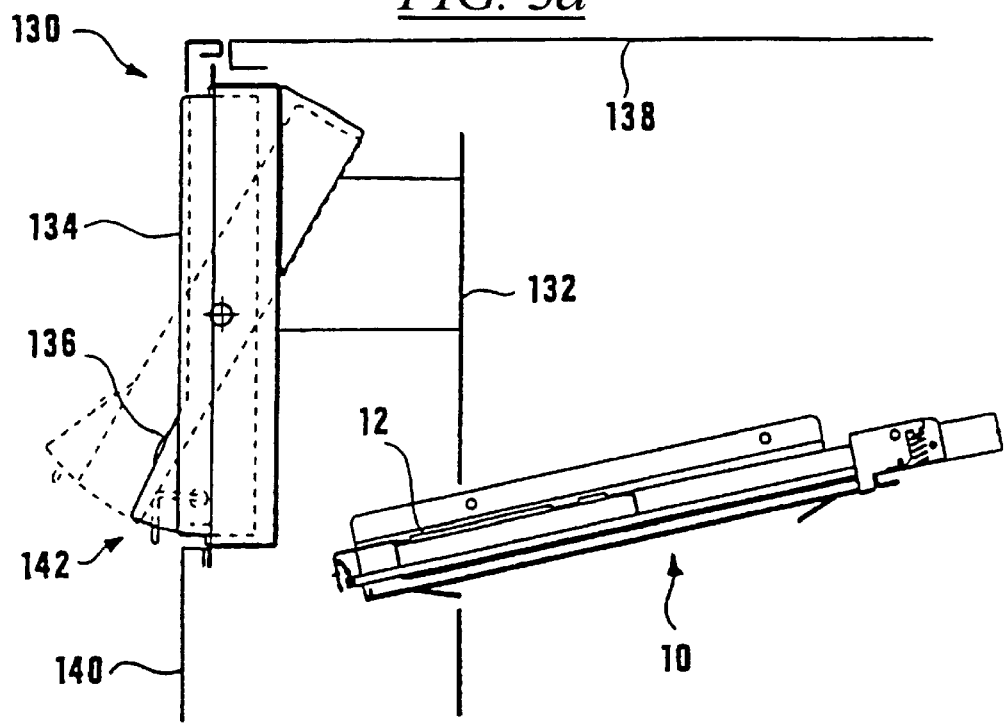
FIG. 3a is a diagrammatical view of the arrangement of the holding apparatus in an idle or retracted position in the printer.

FIG. 3a shows the arrangement of the holding apparatus 10 in the printer 130. The printer 130 has a cabinet with a frame 132 on which the holding apparatus 10 is fastened at an angle of approximately 20 degrees to the horizontal. A vertically pivotable display unit 134 is in addition fastened to the frame 132, which unit displays operating states of the printer 130, and on which the actuating elements 136, e.g. for switching the printer 130 on and off, are arranged.

The printer 130 is protected from environmental influences by a sheathing 138 of the cabinet. In the region of the display unit 134 and the holding apparatus 10, the sheathing is formed by a door 140 of the cabinet that has a window 142 for the display unit 134. When the door 140 is closed, access to the keyboard 12 is not possible.

Figure 3B:
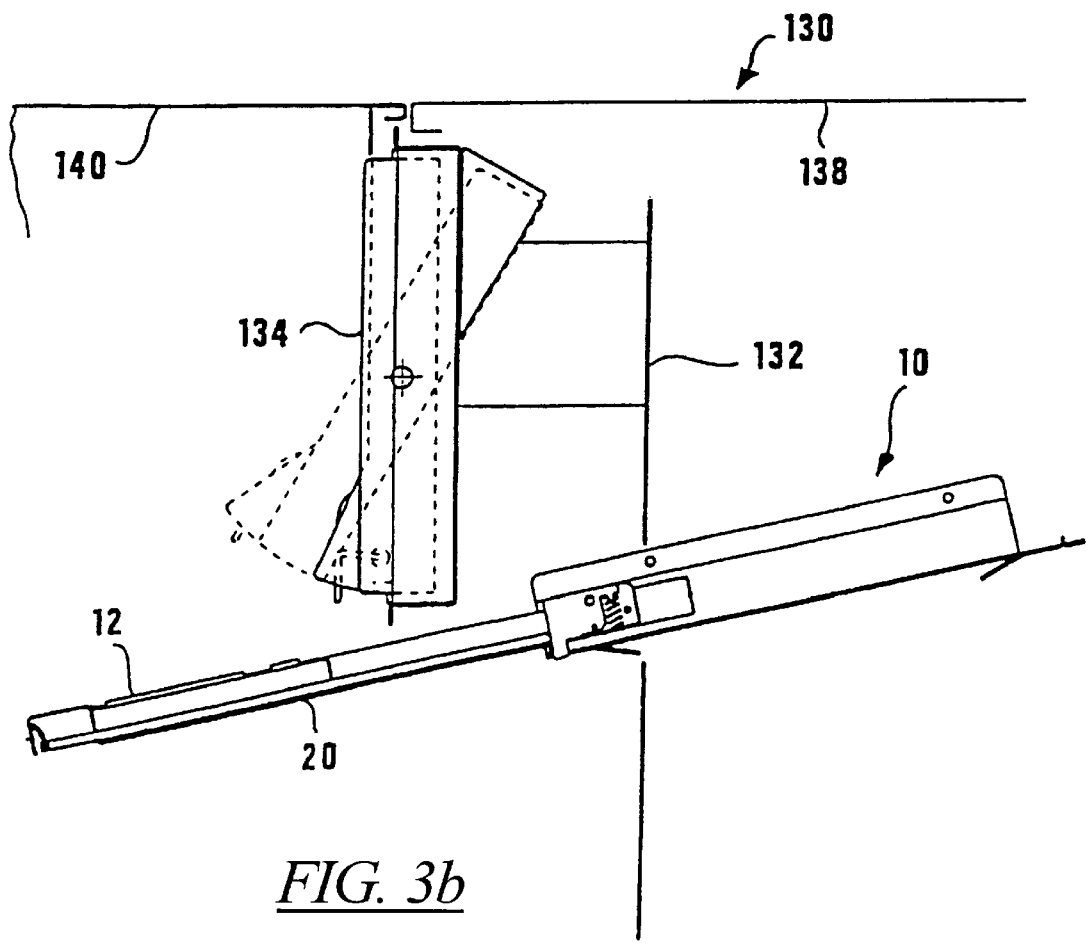
FIG. 3b is a diagrammatic view of the holding apparatus in an operating position in the printer.

FIG. 3b shows the printer 130 when the door 140 is open, which door is opened only by qualified personnel for service purposes. The keyboard 12 is also used for service, so that the qualified operator draws the base plate 20 into the operating position in the manner described above. In the operating position, the keyboard 12 is located underneath the display unit 134, between the operator and the display unit 134, so that particular operating states of the printer 130 are queried via the keyboard, by means of the input of control data. The display unit 134 then indicates the current operational states.

After termination of the service work, the keyboard 12 is again pushed into the idle position. After this, the door 140 is again shut, so that only the actuating elements 136 are still accessible for the operation of the printer 130.

| List of reference characters | |
|---|---|
| 10 | Holding apparatus |
| 12 | Keyboard |
| 14, 16 | Guide receptacle |
| 18 | Connection line |
| 20 | Round plate |
| 22 | Fastening sheet |
| 24, 26 | Telescope rail |
| 28, 29 | Arrow |
| 30 | Support surface |
| 32 | Actuating element |
| 34 | Snap element |
| 36 | Lever |
| 38 | Angle steel |
| 40 | Axis of rotation |
| 42 | Rivet |
| 44 | Spring |
| 46, 48 | Opening |
| 60 | Sheet |
| 62, 64 | Slopes |
| 66 | Sheet |
| 68 | Projection |
| 69 | Arrow |
| 70, 72 | Stop surface |
| 74, 76 | Bearing |
| 78 | Arrow |
| 90 | Hollow space |
| 92 | Hinge |
| 94 | Arrow |
| 96 | Finger |
| 98 | Thumb |
| 100 | Arrow |
| P1 | Position |
| 110, 112 | Balls |

-continued

List of reference characters

| | |
|---|---|
| 114 | Bolt |
| 116 | Securing ring |
| 118 | Bolt |
| 120 | Securing ring |
| 130 | Printer |
| 132 | Frame |
| 134 | Display unit |
| 136 | Actuating element |
| 138 | Sheathing |
| 140 | Door |
| 142 | Window |

What is claimed is:

1. An apparatus comprising a cabinet, a device selected from a printer and copier being positioned in the cabinet, said device having an input unit for providing control data to the device, said apparatus having means for supporting the input unit for movement along a plane between an idle position inside the cabinet and an operating position with the input unit extending outside of the cabinet for actuation, said means including a base plate for receiving the input unit, said plate having at least one guide element being movably housed by a receptacle element being arranged on the device to be inclined to a horizontal so that the plane of movement of the input unit is downwardly inclined from the idle position to the operating position.

2. An apparatus according to claim 1, wherein the guide element is arranged in a first edge region of the plate and a second guide element is arranged at a second edge region of the plate opposite the first edge region.

3. An apparatus according to claim 2, wherein the base plate has a support surface arranged adjacent an end of the guide elements facing away from the device and extends transverse to a direction of motion between the idle and operating positions.

4. An apparatus according to claim 1 wherein, in the operating position, the end of the guide element facing away from the device protrudes past the end of the receptacle element facing away from the device by at least the length of the input unit in a direction of motion between the idle and operating positions.

5. An apparatus according to claim 1, wherein the guide element is a rail surrounded at least partially by the receptacle element with balls being arranged between the guide element and the receptacle element.

6. An apparatus according to claim 1, which includes at least one snap element for fixing the position of the guide element in at least one of the idle and operating positions.

7. An apparatus according to claim 6, wherein the snap element is arranged on the end region of the guide element facing the device, and wherein the snap element is connected with a lever that ends near the input unit.

8. An apparatus according to claim 6, wherein a resetting element for the automatic resetting of the snap element into a fixing position is arranged on the snap element.

9. An apparatus according to claim 1, which includes a first braking apparatus for braking the motion of the input unit in the direction toward the operating position, and a second braking apparatus for braking the motion of the input unit in the direction toward the idle position.

10. An apparatus according to claim 7, which includes a spring biased snap element and wherein the braking apparatus contains at least one slope that is arranged in the region of motion of the snap element.

11. An apparatus according to claim 1, wherein the receptacle element is arranged underneath a printer control panel.

12. An apparatus according to claim 1, which includes locking means for preventing movement into the operating position being arranged in the path of the input unit from the idle position to the operating position.

13. An apparatus according to claim 1, wherein the receptacle element is inclined at an angle of 20 degrees.

14. Apparatus comprising a cabinet, a device selected from a printer and copier being positioned in the cabinet, said device having a display unit and an input unit for providing control data to the device, said apparatus having means for supporting the input unit for movement along a plane of movement between an idle position inside the cabinet and an operating position with the input unit extending outside of the cabinet for actuation, said means including a base plate for receiving the input unit, said plate having at least one guide element being movably housed by a receptacle element being arranged on the device to be inclined to a horizontal so that the plane of movement of the input unit is downwardly inclined from the idle position to the operating position, said base plate having a supporting surface arranged adjacent to an end of the guide element facing away from the device and extending transverse to the direction of motion between the idle and operating position, said means having a snap element and wherein the support surface having a hollow space in which an actuating element for the actuation of the snap element is arrange.

15. Apparatus according to claim 14, wherein the actuating element extends transverse to the direction of motion.

16. Apparatus according to claim 14, wherein the actuating element is mounted so as to be able to pivot about an axis transverse to the direction of motion, and is connected by a lever to the snap element.

* * * * *